United States Patent [19]

Noguchi

[11] Patent Number: 4,506,376
[45] Date of Patent: Mar. 19, 1985

[54] SUBCARRIER SIGNAL GENERATOR FOR USE IN STEREO TUNERS

[75] Inventor: Tadashi Noguchi, Tokyo, Japan

[73] Assignee: Pioneer Electronic Corporation, Tokyo, Japan

[21] Appl. No.: 450,174

[22] Filed: Dec. 16, 1982

[30] Foreign Application Priority Data

Dec. 17, 1981 [JP] Japan .................. 56-204186
Dec. 18, 1981 [JP] Japan .................. 56-204707

[51] Int. Cl.³ .............................................. H04H 5/00
[52] U.S. Cl. ........................................ 381/4; 455/265; 329/122
[58] Field of Search ....................... 381/2–14; 329/50, 122, 167, 123–125; 455/208, 260, 265, 45

[56] References Cited

U.S. PATENT DOCUMENTS

| | | | |
|---|---|---|---|
| 3,714,595 | 1/1973 | Denenberg et al. | 381/4 X |
| 3,842,211 | 10/1974 | Metro | 381/4 |
| 4,334,125 | 6/1982 | Inoue | 381/7 |
| 4,356,350 | 10/1982 | Ienaka | 381/7 |

*Primary Examiner*—Gene Z. Rubinson
*Assistant Examiner*—W. J. Brady
*Attorney, Agent, or Firm*—Sughrue, Mion, Zinn, Macpeak and Seas

[57] ABSTRACT

First and second rectangular signals which are 90° out of phase with each other are derived by comparators and an RS flip-flop from a symmetrical triangular wave signal. The first rectangular signal is halved in frequency by a frequency divider, the output of which is supplied to an adder. The second rectangular wave signal is also delivered to the adder. An output from the adder is converted by a bandpass filter into a sine-wave subcarrier signal in synchronism with a stereo pilot signal in an FM stereo tuner. The first and second rectangular signals may be derived by a pair of D-type flip-flops from a pulse signal.

7 Claims, 37 Drawing Figures

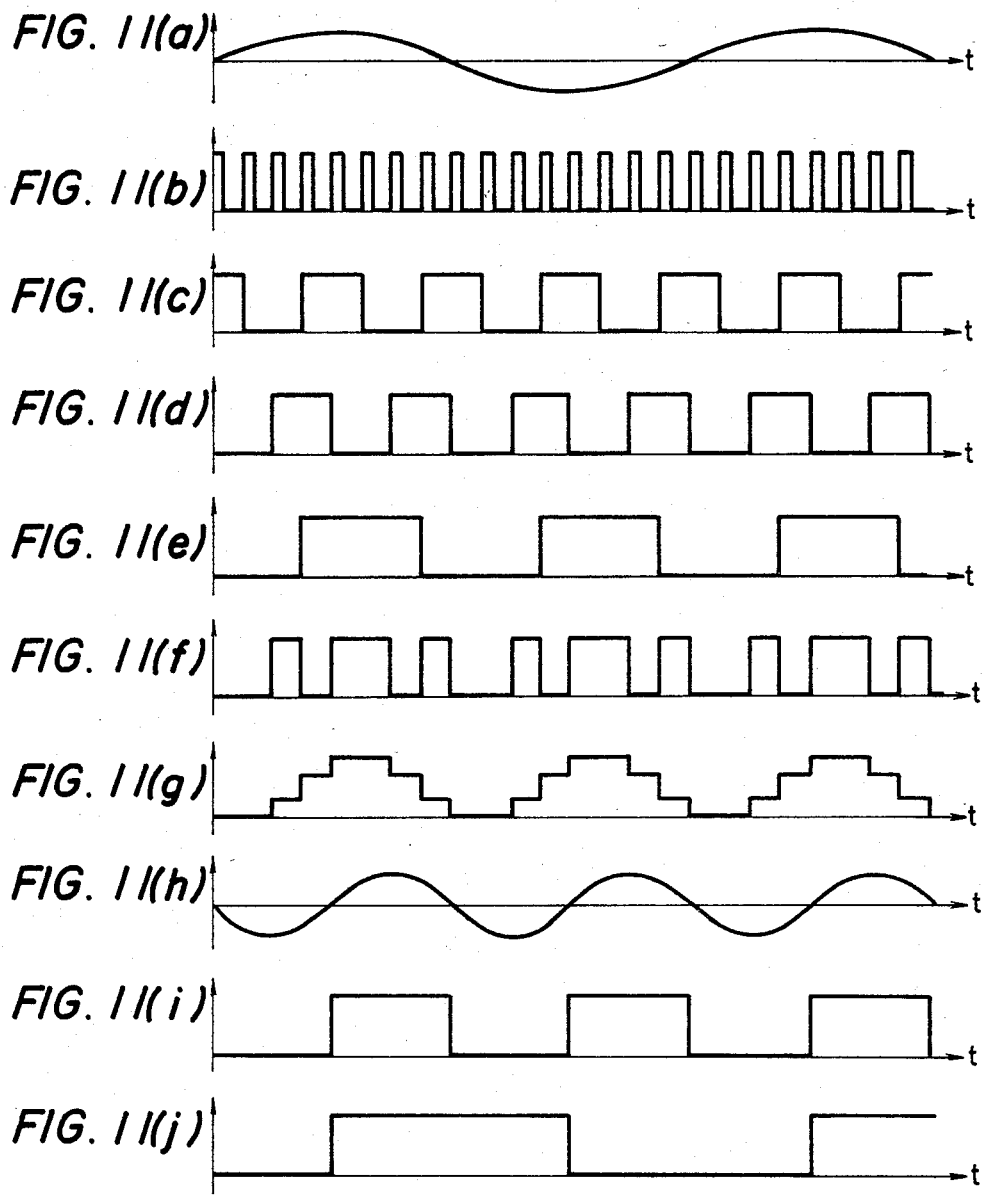

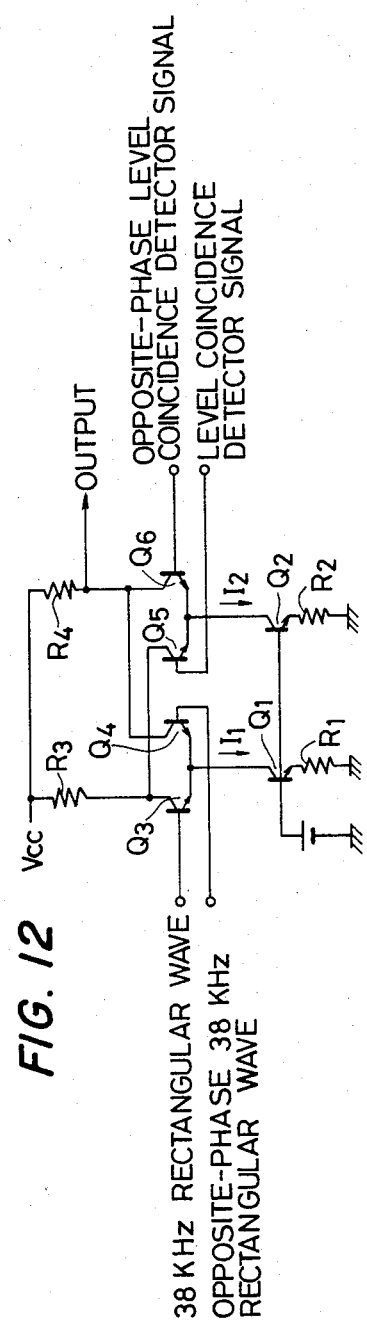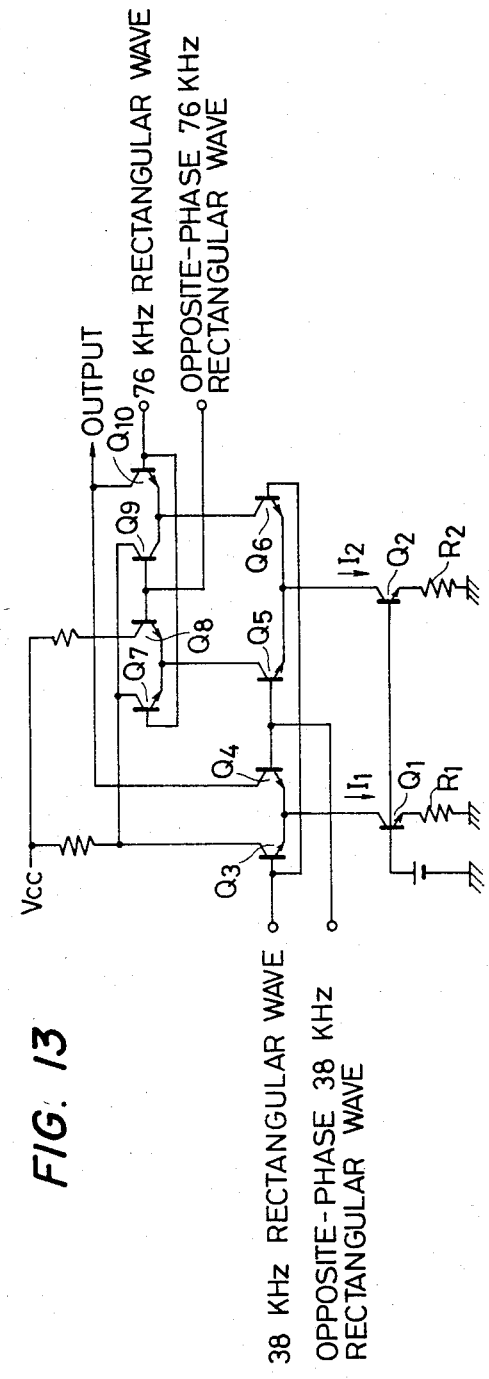

SUBCARRIER SIGNAL GENERATOR FOR USE IN STEREO TUNERS

BACKGROUND OF THE INVENTION

The present invention relates to a subcarrier signal generator for a stereo tuner, and more particularly to a device for generating a sine-wave subcarrier signal in synchronism with a stereo pilot signal in an FM stereo tuner.

Multiplex demodulators in FM stereo tuners generate a 38-KHz sine-wave subcarrier signal and multiply this signal with a stereo composite signal to demodulate a subchannel signal in the stereo composite signal. There has previously been used a PLL (phase-locked loop) circuit as shown in FIG. 1 of the accompanying drawings to produce the 38-KHz subcarrier signal in synchronism with a pilot signal.

The pilot signal a is compared by a phase comparator 1 with a 19-KHz signal f from a ½ (one-half) frequency divider 2, and the output from the phase comparator 1 is supplied through a low-pass filter 3 and DC amplifier 4 to a voltage-controlled oscillator 5. The voltage-controlled oscillator 5 generates trigger pulses b of 76-KHz, which are converted by a ½ frequency divider 6 into a 38-KHz rectangular wave c, which is then fed to a bandpass filer 7 (which may be a low-pass filter) which produces a 38-KHz sine-wave subcarrier signal d. The subcarrier signal d is converted by a level comparator 8 into an in-phase rectangular wave signal e, which is then converted by the frequency divider 2 into the 19-KHz signal f. The sine-wave subcarrier signal d is thus produced in synchronism with the stereo pilot signal a in the stereo composite signal. FIGS. 2(a) through (f) respectively show the waveforms of the signals a through f generated in the circuit of FIG. 1.

The 38-KHz rectangular wave signal supplied to the bandpass filter 7 can be expressed by:

$$V(t)=(4/\pi)\sin \omega st+(4/3\pi)\sin 3\omega st+(4/5\pi)\sin 4\omega st+ \quad (1)$$

where $\omega s$ is the angular frequency of the subcarrier signal. The waveform defined by the equation (1) is as shown in FIG. 3(a), and its frequency spectrum is as illustrated in FIG. 3(b). Since the 38-KHz rectangular wave signal contains odd-numbered harmonics such as the third, fifth and so on, having levels of ⅓, 1/5 etc, respectively, of the fundamental, the bandpass filter 7 is required to have transmission characteristics as shown in FIG. 4. This is disadvantageous in that the bandpass filter 7 requires many filter elements, and the 38-KHz sine wave tends to vary in level due to temperature drifts as the gain starts to drop in the vicinity of 38 KHz.

SUMMARY OF THE INVENTION

It is an object of the present invention to provide a subcarrier signal generator for FM stereo tuners which removes the harmonics, such as the third, fifth and so on, contained in a 38-KHz rectangular wave signal, to allow the filter to be designed with ease to thereby eliminate level variations at 38-KHz.

According to the present invention, the subcarrier signal generator for use in such a stereo tuner includes means for generating first and second rectangular signals which are 90° out of phase with each other, the first rectangular signal being frequency-divided by a ½ frequency divider, the output of which is supplied to an adder. The second rectangular wave signal is also delivered to the adder. The output from the adder is converted by a bandpass filter into a sine-wave subcarrier signal in synchronism with a stereo pilot signal in the FM stereo tuner. According to one embodiment, the first and second rectangular wave signals are derived by comparators and an RS flip-flop from a symmetrical triangular wave signal of a duty cycle of 50% which is in sychronism with the stereo pilot signal and has a fundamental of a frequency which is four times higher than the frequency of the pilot signal. According to another embodiment, the first and second rectangular signals are derived by a pair of D-type flip-flops from a pulse signal.

The above and other objects, features and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIGS. 11(a) through (j) ae diagrams showing the waveforms of signals produced in the subcarrier signal generator shown in FIG. 10;

FIG. 12 is a detailed circuit diagram of an adder of the subcarrier signal generator shown in FIG. 10; and FIG. 13 is a detailed circuit diagram of an adder with a level coincidence detector of the subcarrier signal generator shown in FIG. 10;

DETAILED DESCRIPTION OF THE PREFERRED EMBODIMENTS

Figure 1:
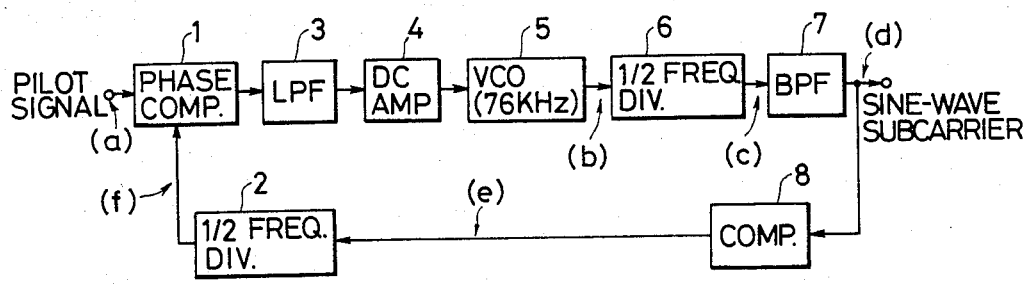
FIG. 1 is a block diagram of a conventional 38-KHz subcarrier signal generator.
Figure 2A:
FIGS. 2(a) through (f) are diagrams showing the waveforms of signals produced in the subcarrier signal generator shown in FIG. 1.
Figure 2B:
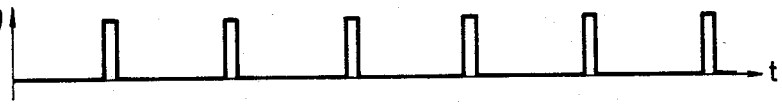
Figure 2C:
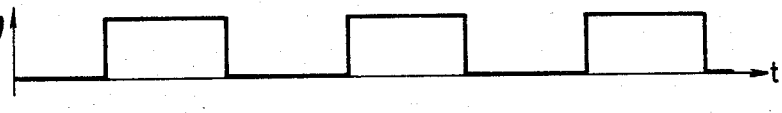
Figure 2D:
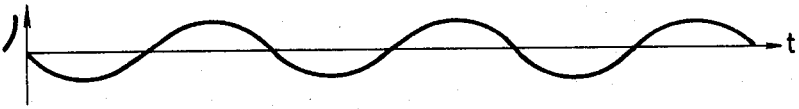
Figure 2E:
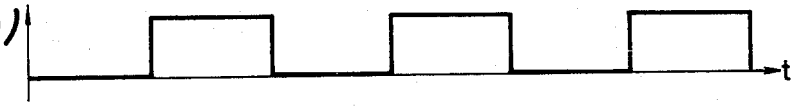
Figure 2F:
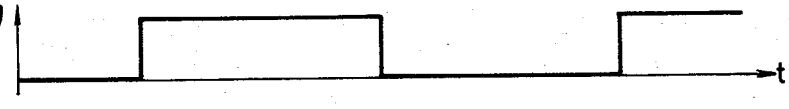
Figure 3A:
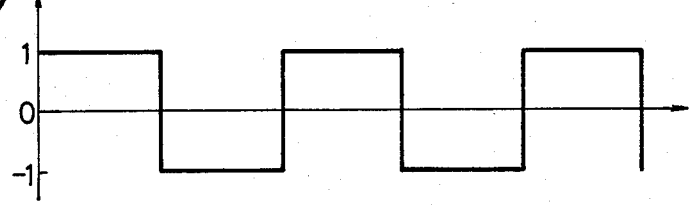
FIGS. 3(a) and (b) are diagrams showing the waveform and frequency spectrum of a 38-KHz rectangular wave signal in the subcarrier signal generator of FIG. 1.
Figure 3B:
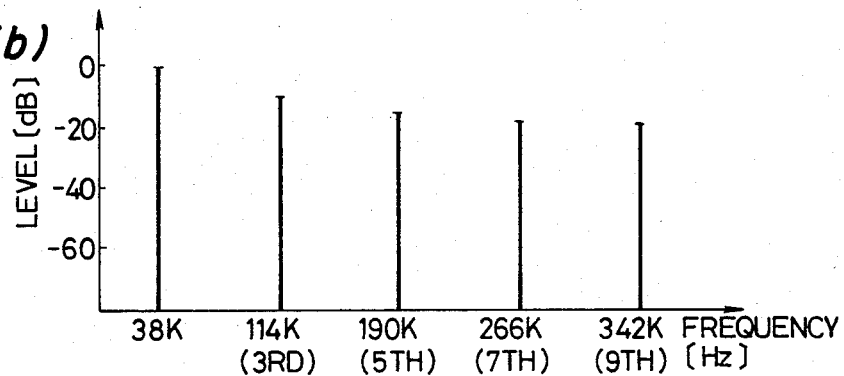
Figure 4:
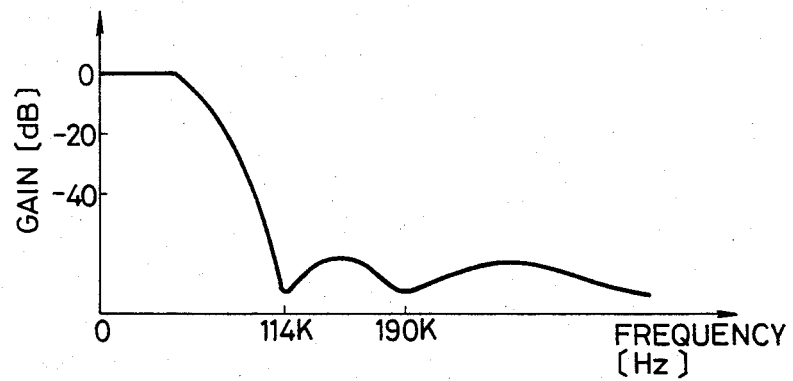
FIG. 4 is a diagram illustrating the transmission characteristics of a bandpass filter in the subcarrier signal generator of FIG. 1.
Figure 5:
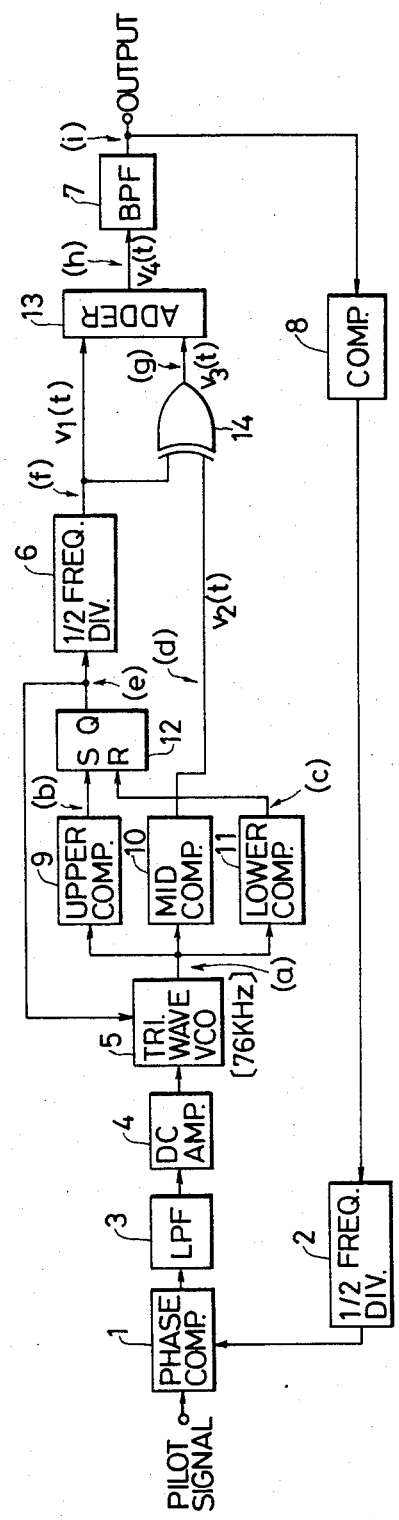
FIG. 5 is a block diagram of a subcarrier signal generator according to one embodiment of the present invention.

FIG. 5 shows a subcarrier signal generator according to one embodiment of the present invention. Like or corresponding parts in FIG. 5 are denoted by the like or corresponding reference characters of FIG. 1, and will not be described in detail. A voltage-controlled oscillator 5 generates a symmetrical triangular wave a having a 76-KHz fundamental with a duty cycle of 50%. The output a from the voltage-controlled oscillator 5 is supplied to each of three level comparators 9 through 11. The comparator 10 has a reference level equal to a central level of the triangular signal a and produces a rectangular output d of 76 KHz ($2\omega s$, a frequency which is four times the frequency of the pilot signal) with a duty cycle of 50%, the output d being referred to as a first rectangular signal. The comparators 9, 11 have reference levels which are the same as the highest and lowest levels, respectively, of the triangular signal a, and produce outputs b, c, respectively, which comprise trains of pulses having momentary high levels in timed relation with the highest and lowest levels, respectively, of the triangular signal a. The timing signals b, c serve as set and reset inputs to an RS flip-flop 12, which generates at its Q output a rectangular signal e having a pulse width equal to the time interval between adjacent highest and lowest levels of the triangular signal a and a duty cycle of 50%. The signal e is referred to as a second rectangular signal. The second rectangular signal e is fed back to the voltage-controlled oscillator 5 to control the generation of the triangular signal a.

The second rectangular signal e is frequency-divided by a ½ frequency divider 6 into a signal f having half the frequency, which is delivered to one input of an adder 13 and also to one input of an exclusive-OR gate 14 serving as a level coincidence detector. The first rectangular signal d is applied to the other input of the exclusive-OR gate 14. An output g from the gate 14 is supplied to the other input of the adder 13. The adder 13 produces an output h which is converted by a bandpass filter 7 (which may be a low-pass filter) into a sine-wave subcarrier signal i which is transmitted as an output from the subcarrier signal generator shown in FIG. 5. The sine-wave subcarrier signal i is also converted by the level comparator 8 into a 38-KHz rectangular wave, which is then converted by the ½ frequency divider 2 into a 19-KHz rectangular wave, which is compared with a stereo pilot signal in the phase comparator 1.

FIGS. 6(a) through (i) show the signals (a) through (i), respectively, generated in the circuit shown in FIG. 5. When the output voltage of the voltage-controlled oscillator 5 is increased until it reaches the reference level of the upper-level comparator 9, the output b therefrom assumes a high level, whereupon the flip-flop 12 is set and its Q output e goes high and simultaneously the output a from the voltage-controlled oscillator 5 starts dropping. Then, the output of the upper-level comparator 9 drops again. Since the output of the flip-flop 12 is kept at the high level, the output a from the voltage-controlled oscillator 5 continues to drop until it reaches the reference level of the lower-level comparator 11, whereupon the output c thereof goes high to reset the flip-flop 12, the output e of which then goes low. The output a from the voltage-controlled oscillator 5 starts increasing again and the output c from the lower-level comparator 11 again goes low. Since the output e from the flip-flop 12 remains low at this time, the output a from the voltage-controlled oscillator 5 continues to rise. The above cycle of operation is cyclically repeated.

Figure 6A:
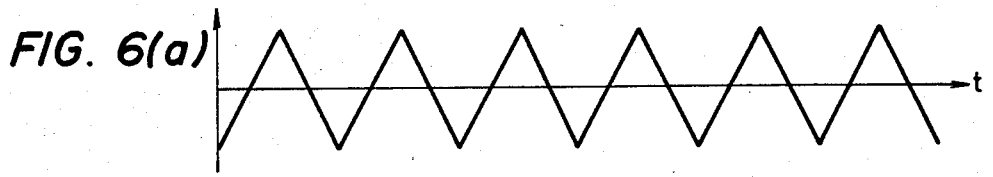
FIGS. 6(a) through (i) are diagram showing the waveforms of signals produced in the subcarrier signal generator shown in FIG. 5.
Figure 6B:
Figure 6C:
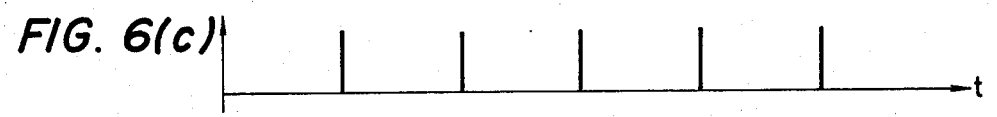
Figure 6D:
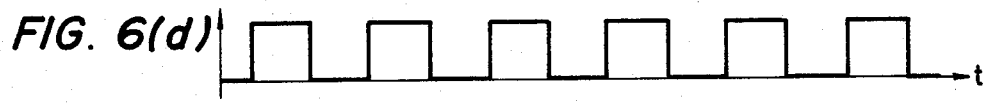
Figure 6E:
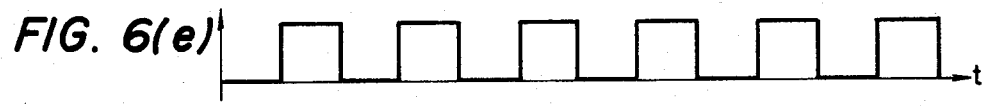
Figure 6F:
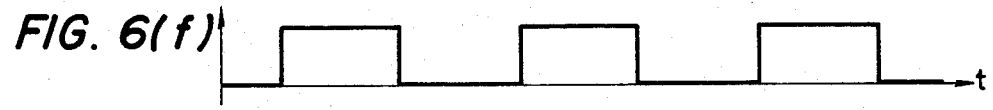

The output e from the flip-flop 12 has a frequency of 76 KHz, and likewise the output d from the midlevel comparator 10 has a frequency of 76 KHz. The outputs e, d are 90° out of phase with each other and have a duty cycle of 50%, as shown in FIGS. 6(e) and (d). The output e from the flip-flop 12 is frequency-divided by the frequency divider 6 into the 38-KHz rectangular wave f which is in synchronism with the pilot signal.

Figure 6G:
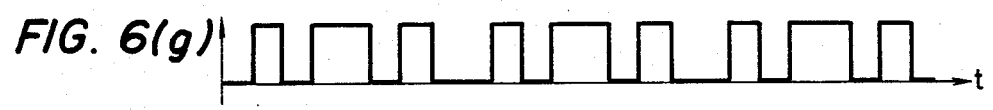
Figure 6H:
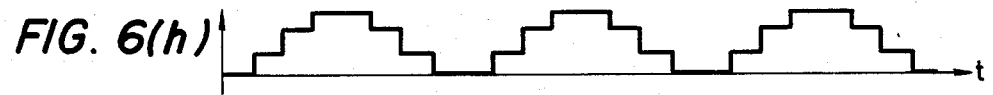
Figure 6I:
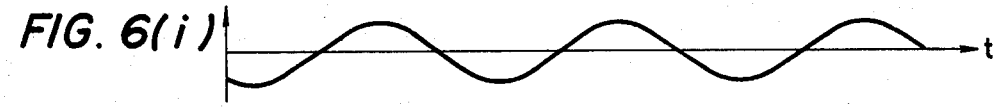

The 76-KHz rectangular wave d generated by the midlevel comparator 10 is out of phase with the 38-KHz rectangular wave by ⅛ of a period. The signals f, d are supplied to the level coincidence detector 14, which provides the output as shown in FIG. 6(g).

The waveform as shown in FIG. 5(h) can be formed by adding the output f from the divider 6 and the output g from the level coincidence detector 14 at a level ratio of ($\sqrt{2}+1$):1. The signal h is supplied to the bandpass filter 7, by which only a fundamental component is extracted from the signal h, producing the limited subcarrier of 38 KHz shown in FIG. 5(i).

Figure 7:
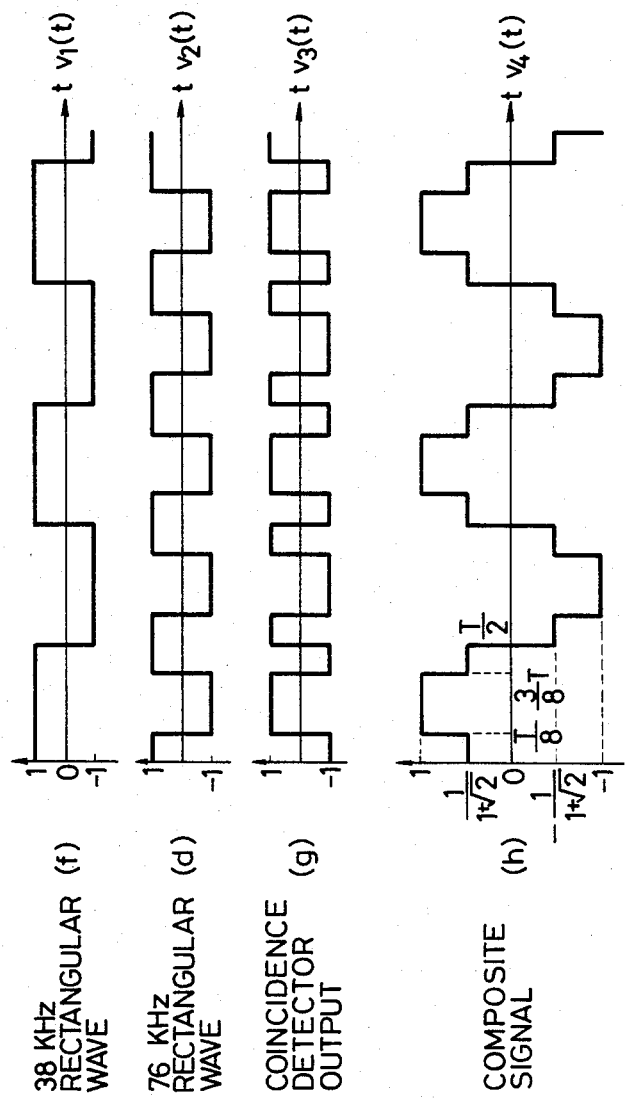
FIG. 7 is a set of diagrams illustrative in detail of some of the waveforms generated in the subcarrier signal generator of FIG. 5.

FIG. 7 shows a detail the waveforms of the signals d, f, d and h generated in the circuit of FIG. 5. Assuming that the 38-KHz rectangular wave f shown in FIG. 7 is expressed as $v_1(t)$, it is given by:

$$v_1(t)=(4/\pi) \sin \omega st+(4/3\pi) \sin 3\omega st+(4/5\pi) \sin 5\omega st+ \qquad 2)$$

The 76-KHz rectangular wave d expressed as $v_2(t)$ is defined as follows:

$$v_2(t)=(4/\pi) \sin 2\omega s(t-T/8)+(4/3\pi) \sin 6\omega s(t-T/8)+(4/5\pi) \sin 10\omega s(t-T/8)+ \qquad 3)$$

where T is one period of the 38-KHz rectangular wave. The output g from the level coincidence detector 14, given as $v_3(t)$, is expressed by the following equation:

$$v_3(t)=(4/\pi)[(\sqrt{2}-1) \sin \omega st-\{(\sqrt{2}+1)/3\} \sin 3\omega st-\{(\sqrt{2}+1)/5\} \sin 5\omega st-\{(\sqrt{2}-1)/7\} \sin 7\omega st+ \qquad 4)$$

By adding the signals $v_1(t)$, $v_3(t)$ expressed respectively by equations (2), (4) at the level ratio of ($\sqrt{2}+1$):1, the output h from the adder 13 can be expressed by:

$$v_4(t)=\{8/(\sqrt{2}+1)\pi\}\cdot\{\sin \omega st+(1/7) \sin 7\omega st+(1/9) \sin 9\omega st+\ldots\} \qquad 5)$$

Accordingly, the output h does not contain third and fifth harmonics.

Figure 8A:
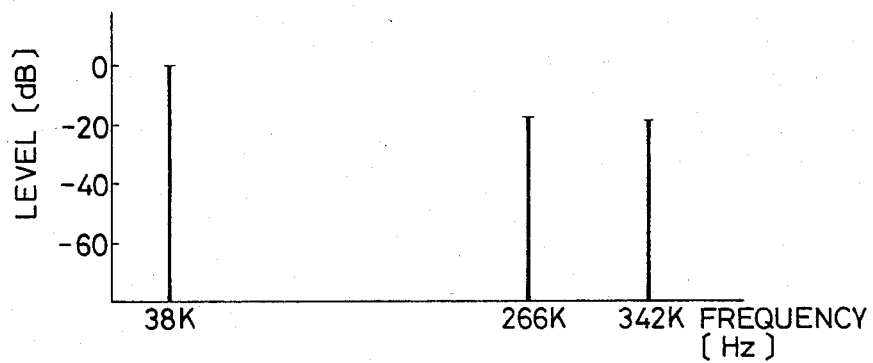
FIGS. 8(a) and (b) are diagrams showing characteristics of the subcarrier signal generator shown in FIG. 5.
Figure 8B:
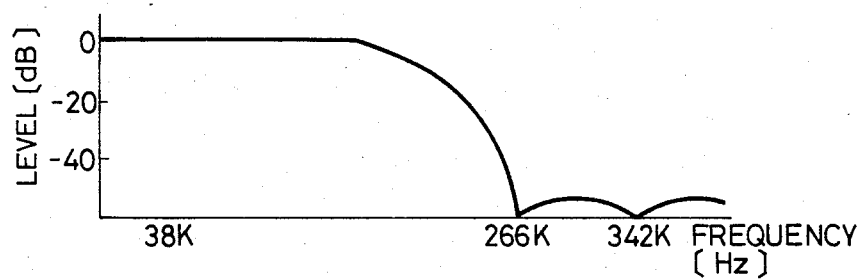

The output $v_4(t)$ or the signal h has a frequency spectrum as illustrated in FIG. 8(a) which allows the band width of the bandpass filter 7 to be extended to a higher frequency as shown in FIG. 8(b). Therefore, the filter 7 can more easily be designed, and level variations at 38 KHz can be prevented.

Figure 9:
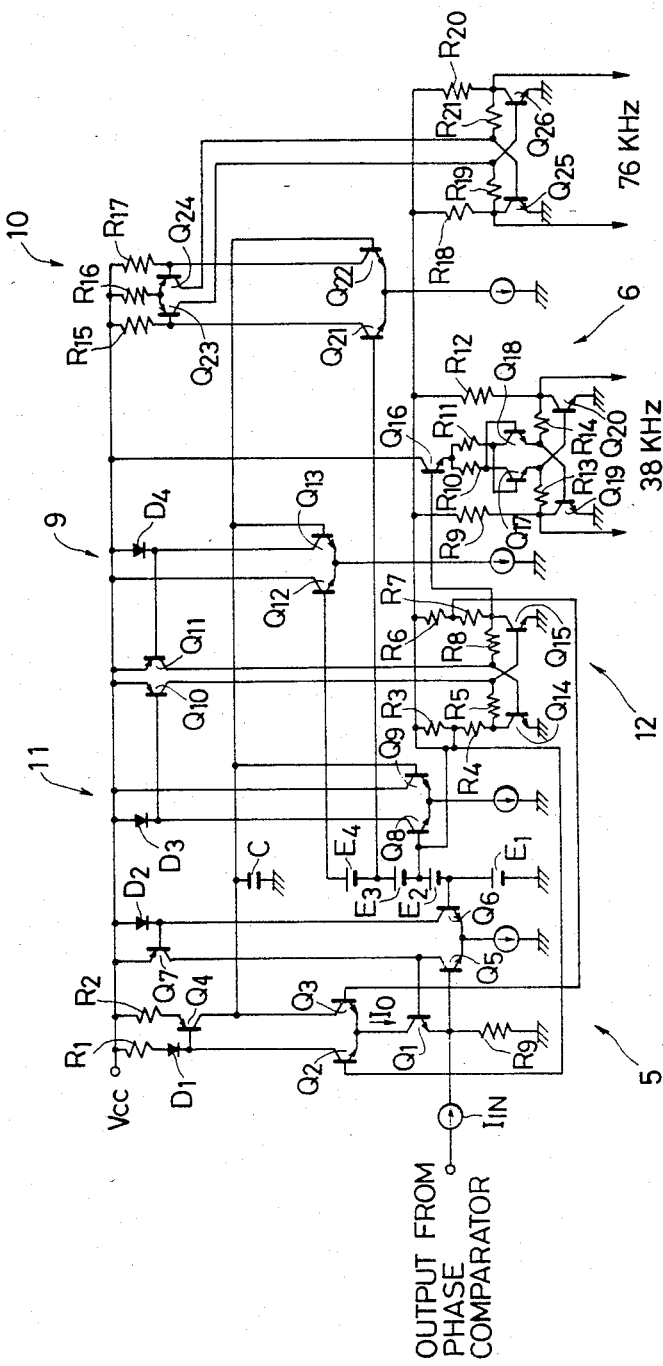
FIG. 9 is a detailed circuit diagram of a portion of the subcarrier signal generator showin in FIG. 5.

FIG. 9 shows a detailed circuit arrangement of a portion of the subcarrier signal generator as illustrated in FIG. 5. The output from the phase comparator 1 is supplied via the low-pass filter 3 and the DC amplifier 4 as a current output ($I_{IN}$) to the voltage-controlled oscillator 5. The voltage-controlled oscillator 5 is arranged such that it will produce a triangular signal by charging and discharging a capacitor C with a constant current Io, and comprising a differential amplifier composed of differential transistors $Q_2$, $Q_3$ and a transistor $Q_1$ serving as a current source. The transistor $Q_1$ has an emitter potential of $E_1$ fixed by a feedback amplifier of transistors $Q_5$, $Q_6$, $Q_7$ and a diode $D_2$. The collector current Io of the transistor $Q_1$ is expressed by:

$$Io=E/Ro-I_{IN} \qquad ?)$$

and is hence variable with the output from the phase comparator 1. The collector current Io serves to charge and discharge the capacitor C to control the tilt angle of the voltage across the capacitor C.

The lower-level comparator 11 is in the form of a differential circuit comprising transistors $Q_8$, $Q_9$, and the higher-level comparator 9 is in the form of a differential circuit comprising transistors $Q_{12}$, $Q_{13}$. The mid-level comparator 10 comprises a differential circuit of transistors $Q_{21}$, $Q_{22}$. The reference level of the lower-level comparator 11 is a voltage $(E_1+E_2)$, that of the upper-level comparator 9 is a voltage $(E_1+E_2+E_3+E_4)$, and that of the midlevel comparator 10 is a voltage $(E_1+E_2+E_3)$, the voltage $E_3$ being equal to the voltage $E_4$. The R-S flip-flop 12 is composed of transistors $Q_{14}$, $Q_{15}$, and resistors $R_3$ through $R_8$, and the frequency divider 6 is composed of transistors $Q_{17}$ through $Q_{20}$ and resistors $R_9$ through $R_{14}$. Transistors $Q_{25}$, $Q_{26}$ and resistors $R_{18}$ through $R_{21}$ constitute a flip-flop for shaping the 76-KHz rectangular wave. The capacitor C is switchingly charged and discharged under the control of the differential circuit comprising the transistors $Q_2$ through $Q_4$, the diode $D_1$, and resistors $R_1$, $R_2$. To effect such control, the outputs from the flip-flop 12 are supplied to the bases of the differential transistors $Q_2$, $Q_3$. When the transistor $Q_{15}$ is turned on, the transistor $Q_2$ is turned on to enable the transistor $Q_4$ to charge the capacitor C with the current Io. On the other hand, when the transistor $Q_{14}$ is turned on, the transistor $Q_1$ is turned on and the transistor $Q_4$ is turned off, allowing the capacitor C to be discharged with the current Io. As a result, the oscillator 5 generates a symmetrical triangular wave having a duty cycle of 50%.

Figure 10:
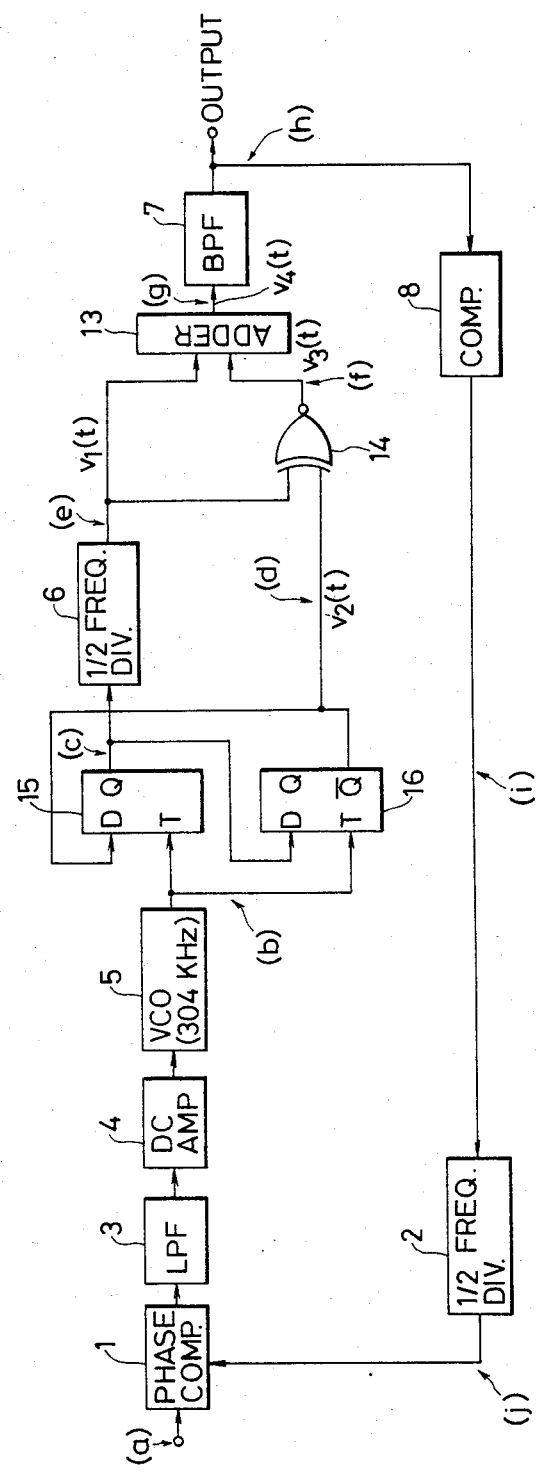
FIG. 10 is a block diagram of a subcarrier signal generator according to another embodiment of the present invention.

FIG. 10 illustrates a subcarrier signal generator according to another embodiment of the present invention. The subcarrier signal generator shown in FIG. 10 differs from that of FIG. 5 in that the voltage-controlled oscillator 5 produces a pulse signal of 304 KHz, and D-type flip-flops 15, 16 are connected between the voltage-controlled oscillator 5 and the ½ frequency divider 6 and the exclusive-OR gate 14. The D-type flip-flops 15, 16 are connected as a ring counter in which an output b from the voltage-controlled oscillator 5 is applied to both trigger inputs T of the flip-flops 15, 16, and a Q output c from the flip-flop 15 is supplied as a data input to the flip-flop 16 while a $\overline{Q}$ output d from the flip-flop 16 serves as a data input to the flip-flop 15. The Q output c from the D-type flip-flop 15 is frequency-divided by the frequency divider 6, which produces an output e supplied to one input of the adder 13 and to one input of the exclusive-OR gate 14. The $\overline{Q}$ output d from the D-type flip-flop 16 is fed to the other input of the exclusive-OR gate 14, which delivers its output f to the other input of the adder 13. The adder 13 directs its output g to the bandpass filter 7, which produces an output h serving as a sine-wave subcarrier signal and is also converted by the level comparator 8 into a 38-KHz rectangular wave i, which is converted by ½ frequency divider 2 into a 19-KHz rectangular wave j which is compared with the stereo pilot signal a by the phase comparator 1.

FIGS. 11(a) through (j) are illustrative respectively of the waveforms of the signals (a) through (j) produced in the circuit of FIG. 10. The voltage-controlled oscillator 5 produces trigger pulses at 304 KHz ($6\omega s$) as shown in FIG. 11(b) which are supplied to the ring counter of the D-type flip-flops 15, 16, which produce rectangular waves c, d, respectively, of a duty cycle of 50%, which are 90° out of phase with each other and have a frequency of 76 KHz ($2\omega s$), four times the frequency of the pilot signal. The output c is frequency-divided by the frequency divider 6 into the rectangular wave e of 38 KHz ($\omega s$). The level coincidence detector 12 is supplied with the rectangular wave e and the output d to produce the output f. The output waveform as shown in FIG. 11(g) is generated by the adder 13 by adding the output e from the frequency divider 6 and the output f from the level coincidence detector 14 at a level ratio of $(\sqrt{2}+1):1$. The output g is then fed to the bandpass filter 7, which extracts only the fundamental component from the output g to generate the sine-wave subcarrier h shown in FIG. 11(h).

The waveforms d, e, f and g generated in the circuit of FIG. 10 correspond respectively to the waveforms shown in FIGS. 7(d), (f), (g) and (h).

Above equations (2) through (5) are equally applicable to the circuit arrangements of FIG. 10, so that the generated subcarrier signal contains no third and fifth harmonics. The output signal g from the adder 13 has a frequency spectrum as shown in FIG. 8(a) and the band width of the bandpass filter 7 is as shown in FIG. 8(b).

FIG. 12 illustrates in detail a circuit arrangment of the adder 13. Differential transistors $Q_3$, $Q_4$ are switched on and off by 38-KHz rectangular waves in opposite phases; and differential transistors $Q_5$, $Q_6$ by signals of opposite phases derived from the output from the level coincidence detector 14. The collector outputs of the transistors $Q_3$, $Q_5$ are added, and similarly the collector outputs of the transistors $Q_4$, $Q_6$ are added. One of the added collector outputs is led out as a sum output. The level ratio at which the outputs are added is determined by the ratio between currents from transistors $Q_1$, $Q_2$ serving as current sources, the level ratio being selected here to be $I_1/I_2=\sqrt{2}+1$.

FIG. 13 shows a modified arrangement for the adder 13 with the level coincidence detector 12 included. Identical parts in FIG. 13 are denoted by the reference characters of FIG. 12. The transistors $Q_3$, $Q_4$, $Q_5$, $Q_6$ are switched on and off by 38-KHz rectangular waves of opposite phases, and the collectors of the transistors $Q_5$, $Q_6$ serves as current sources for pairs of differential transistors $Q_7$, $Q_8$ and $Q_9$, $Q_{10}$. The transistors $Q_7$, $Q_8$ and $Q_9$, $Q_{10}$ are switched on and off by the 76-KHz rectangular waves in opposite phases. The collectors of the transistors $Q_3$, $Q_7$, $Q_9$ are connected in common, and the collectors of the transistors $Q_4$, $Q_8$, $Q_{10}$ are connected in common to produce a composite output. The transistors $Q_5$ through $Q_{10}$ jointly constitute the exclusive-OR gate 14.

With the arrangement of the present invention, the odd-numbered harmonics such as $3\omega s$, $5\omega s$ and the like which have been generated in the phase-locked loop can be eliminated with the result that the bandpass filter or low-pass filter disposed at the output stage of the phase-locked loop can be extended to a higher frequency band, and the damping characteristics can be rendered gradual and smooth. Accordingly, the filter can be designed and constructed easily, and the signal level at 38 KHz is not affected by changes in the filter characteristics.

Although certain preferred embodiments have been shown and described, it should be understood that many changes and modifications may be made therein without departing from the scope of the appended claims.

What is claimed is:

1. A subcarrier signal generator for use in a stereo tuner, comprising:
 means for generating a symmetrical triangular wave signal in synchronism with a stereo pilot signal and having a fundamental of a frequency which is a multiple of a frequency of the stereo pilot signal, said triangular wave signal havng a highest level, a lowest level, and a midlevel between said highest and lowest levels;

first means for generating a first rectangular wave signal by comparing said triangular wave signal with said midlevel thereof as a reference;

second means for generating a second rectangular wave signal having a pulse width equal to a time interval between adjacent highest and lowest levels of said triangular wave signal;

means for frequency-dividing said second rectangular wave signal to provide a frequency divided signal;

level coincidence detector means responsive to said frequency divided signal and said first rectangular wave signal for generating an output;

means for adding said frequency divided signal and said output from said level coincidence detector means at a certain level ratio; and means for extracting a fundamental component from an output of said adding means to produce a subcarrier signal.

2. A subcarrier signal generator according to claim 1, wherein said first means comprises a comparator having a reference level equal to said midlevel, for comparing said triangular wave signal with said reference level.

3. A subcarrier signal generator according to claim 1, wherein said second means comprises an upper-level comparator having a reference level equal to said highest level, a lower-level comparator having a reference level equal to said lowest level, and an RS flip-flop having a set input receptive of an output from said upper-level comparator, a reset input receptive of an output from said lower-level comparator, and an output connected to said frequency-dividing means.

4. A subcarrier signal generator according to claim 1, wherein said certain level ratio is $(\sqrt{2}+1)$.

5. A subcarrier signal generator for use in a stereo tuner, comprising:

means for generating two rectangular wave signals in synchronism with a stereo pilot signal, said rectangular wave signals being 90° out of phase with each other and having a fundamental of a frequency which is a multiple of a frequency of the pilot signal;

means for frequency-dividing one of said rectangular wave signals to provide a frequency divided signal;

level coincidence detector means responsive to said frequency divided signal and the other of said rectangular wave signals for generating an output;

means for adding said frequency divided signal and said output from said level coincidence detector means at a certain level ratio; and means for extracting a fundamental component from an output of said adding means to produce a subcarrier signal.

6. A subcarrier signal generator according to claim 5, wherein said generating means comprises a pair of D-type flip-flops each having a trigger input receptive of a trigger signal, and an output connected to a data input of the other flip-flop, one of the outputs of said flip-flops being connected to said frequency-dividing means.

7. A subcarrier signal generator according to claim 5, wherein said certain level ratio is $(\sqrt{2}+1)$.

* * * * *